United States Patent
Nguyen et al.

(10) Patent No.: US 8,823,573 B1
(45) Date of Patent: Sep. 2, 2014

(54) SYSTEM AND METHOD FOR RECONSTRUCTION OF SPARSE FREQUENCY SPECTRUM FROM AMBIGUOUS UNDER-SAMPLED TIME DOMAIN DATA

(71) Applicant: Raytheon Company, Waltham, MA (US)

(72) Inventors: Tuan V. Nguyen, Anaheim, CA (US); Oleg Brovko, Los Angeles, CA (US); Alison Kim, Palos Verdes Estates, CA (US); Trung T. Nguyen, Huntington Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/772,217

(22) Filed: Feb. 20, 2013

(51) Int. Cl.
   *H03M 1/36* (2006.01)
   *H03M 1/12* (2006.01)

(52) U.S. Cl.
   CPC ...................................... *H03M 1/12* (2013.01)
   USPC .......................................... 341/159; 341/155

(58) Field of Classification Search
   CPC .................................. H03M 1/12; H03M 1/36
   USPC .......................................... 341/155, 159, 123
   See application file for complete search history.

(56) References Cited

U.S. PATENT DOCUMENTS

| 6,064,699 | A * | 5/2000 | Law ............................... | 375/244 |
| 6,646,584 | B2 * | 11/2003 | Nagaraj et al. ................ | 341/155 |
| 6,696,869 | B1 * | 2/2004 | Tan ............................... | 327/108 |
| 7,403,875 | B2 | 7/2008 | Vogel et al. | |
| 7,847,719 | B2 * | 12/2010 | Nguyen et al. ................ | 341/155 |
| 2008/0104163 | A1 | 5/2008 | Barford | |
| 2010/0281090 | A1 | 11/2010 | Chan et al. | |

OTHER PUBLICATIONS

Domínguez-Jiménez, "Analysis and Design of Multirate Synchronous Sampling Schemes for Sparse Multiband Signals", 20th European Signal Processing Conference (EUSIPCO 2012), Aug. 27, 2012 (pp. 1184-1188).

Pace, "Use of the Symmetrical Number System in Resolving Single-Frequency Undersampling Aliases", IEEE Transactions on Signal Processing, IEEE Service Center, New York, vol. 45, No. 5, May 1997 (pp. 1153-1160).

Schmidt, "Multiple Emitter Location and Signal Parameter Estimation", IEEE Transactions on Antennas and Propagation, IEEE Service Center, Piscataway, NJ, US, vol. Ap-34, No. 3, Mar. 1986 (pp. 276-280).

(Continued)

*Primary Examiner* — Brian Young
(74) *Attorney, Agent, or Firm* — Christie, Parker & Hale, LLP

(57) ABSTRACT

System and method for converting a high bandwidth analog signal to a digital signal including: receiving the high bandwidth analog signal; splitting the high bandwidth analog signal to M parallel channels; delaying the split signal in each channel with N*T delays, respectively; sampling each M delayed signals by M relatively prime sampling rate, wherein the sampling rate for each M delayed signal is smaller than the Nyquist frequency of the high bandwidth analog signal; upsampling each M sampled signal, wherein the upsampling rate for each M sampled signal satisfies the Nyquist frequency of the high bandwidth analog signal; combining the M up sampled signals into a combined signal; and reconstructing the combined signal to generate a digital signal representing the high bandwidth analog signal.

15 Claims, 5 Drawing Sheets

(56) References Cited

OTHER PUBLICATIONS

Vaidyanathan, "Sparse Sensing With Co-Prime Samplers and Arrays", IEEE Transactions on Signal Processing, vol. 59, No, 2, Feb. 2011 (pp. 573-586).

Written Opinion of the International Searching Authority for International Application No. PCT/US2014/015848, filed Feb. 11, 2014, Written Opinion of the International Searching Authority mailed May 28, 2014 (10 pgs.).

International Search Report for International Application No. PCT/US2014/015848, filed Feb. 11, 2014, International Search Report dated May 21, 2014 and mailed May 28, 2014 (3 pgs.).

* cited by examiner

SYSTEM AND METHOD FOR RECONSTRUCTION OF SPARSE FREQUENCY SPECTRUM FROM AMBIGUOUS UNDER-SAMPLED TIME DOMAIN DATA

FIELD OF THE INVENTION

The present invention generally relates to signal processing and more particularly to a system and method for reconstruction of sparse frequency spectrum from ambiguous under-sampled time domain data.

BACKGROUND

Digital signal sampling in utilized in many different applications, such as signal (data, speech, video, etc.) processing, high-speed data converters, data communication devices, such as receivers and transmitters and the like.

A sampling rate refers to the frequency of the sampling. To allow a complete reconstruction of the signal being sampled from the discrete sampled data, the sampling rate must comply with the Nyquist theorem, which relies on the sampling occurring at uniform time steps. Nyquist frequency is defined as minimum required sampling frequency for a given signal frequency to allow a complete reconstruction of the signal and avoid aliasing. Accordingly, the sampling frequency has to be larger than the (sometimes twice, depending on the definition) Nyquist frequency.

However, at times, nonuniform digital signal samples are available, rather than uniform signal samples. If a signal to be sampled is sampled nonuniformly and periodically, some typical reconstruction methods may involve use of a filter bank structure. The conventional reconstruction methods require use of high speed analog-to-digital converters to satisfy Nyquist sampling criteria. For example, for a high bandwidth analog signal of 5.25 GHz or greater, conventional methods use a substantial number of relatively complex hardware components, including mixers, filters, amplifiers, and high speed analog-to-digital converters (ADC).

FIG. 1 shows a representative circuit for sampling a high bandwidth analog input signal, using a conventional parallel down conversion method. As shown, this approach employs 10 heterodyne down conversion stages and includes 10 mixers (102a-102j), 10 different frequency local oscillators (103a-103j), 10 low pas filters (104a-104j), 10 amplifiers (106a-106j) and 10 (mid-speed) ADCs (108a-108j) with a sampling frequency to 1.3 GHz. The outputs (109a-109j) of the 10 channels dare separately but identically processed to capture signals present within each segment of the original high bandwidth analog signal x(t) 101. Each of the 10 heterodyne down conversion stages include same components and operate identically.

As shown, the high bandwidth analog signal x(t) 101 is received, for example, by an antenna, and split into 10 down conversion stages. Within each of the ten split signal path, the signal is then mixed with unique local oscillators 103 by mixers 102. The mixed signals are filtered by low pass filters 104 and then amplified by amplifiers 106. The amplified signal are then converted to corresponding digital signals by the ADCs 108 and the digital outputs (109a-109j) of the 10 channels are then combined to reconstruct a digital signal representing the high bandwidth analog signal 101.

Typically, the mixers 102 use a non-linear component to produce both sum and difference signals, each including the modulation contained in the desired signal. The output of the mixer may include the original analog signal at $f_d$ (for example, 5.25 GHz), the local oscillator signal at $f_{LO}$, and the two new frequencies $f_d+f_{LO}$ and $f_d-f_{LO}$. The mixers may inadvertently produce additional frequencies such as 3rd- and higher-order intermodulation products. The undesired signals are removed by the low pass filters 104 leaving only the desired offset IF signal at $f_{IF}$ which contains the original modulation (transmitted information) as the received signal had at $f_d$.

The stages of (IF) amplifiers 106 are typically tuned to a particular frequency not dependent on the receiving frequency to simplify optimization of the circuit. The IF amplifiers 106 may be made highly selective around their center frequencies $f_{IF}$. By tuning the frequency of the local oscillator $f_{LO}$, the resulting difference frequency $f_{LO}-f_d$ (or $f_d-f_{LO}$) are matched to the amplifiers' frequencies $f_{IF}$ for the desired reception frequency $f_d$. The resulting signals are then converted to corresponding digital signals by corresponding ADCs 108 with a sampling frequency substantially lower than that of the high bandwidth analog signal (5.25 GHz). However, this circuit is complex and includes many components, which makes it costly as well.

FIG. 2 illustrates an alternative sampling circuit for sampling a high bandwidth analog input signal, according to the conventional methods. As depicted, this approach employs a single high speed ADC 202 to convert the high bandwidth analog signal 201 (e.g., 5.25 GHz) to a corresponding digital signal 203 with uniform samples. The high speed ADC 202 must have a Nyquist frequency of at least twice the frequency of the analog input signal 201, that is a minimum of 10.5 GS/s, for this example. Accordingly, the high speed ADC suffers from low dynamic range. That is, limitation of the sample-hold settling time, accuracy/stability, and noise contribute to issues within ADCs which restrict dynamic range achievable for very high speed ADCs.

The conventional methods use a substantial number of heterodyne down conversion stages and/or high speed ADCs to maintain a wide bandwidth for spectral reconstruction. Both of the above conventional approaches suffer from a tradeoff between high sampling rate and large dynamic range, or multiplicity of the components and complexity of the resulting circuit.

SUMMARY OF THE INVENTION

The present invention is a method and circuit to reconstruct sparse frequency domain data from sub-Nyquist sampled time domain data.

In some embodiments, the present invention is a method for converting a high bandwidth analog signal to a digital signal. The method includes: receiving the high bandwidth analog signal; splitting the high bandwidth analog signal to M parallel channels; delaying the split signal in each channel with N*T delays, respectively, where N is an integer from 0 to M−1, and T is a period of a clock signal with a minimum frequency of the Nyquist frequency of the high bandwidth analog signal; sampling each M delayed signals by M relatively prime set sampling rate, wherein the sampling rate for each M delayed signal is smaller than the Nyquist frequency of the high bandwidth analog signal; upsampling each M sampled signal using an upsampling ratio, wherein the upsampling rate for each M sampled signal satisfies the Nyquist frequency of the high bandwidth analog signal; combining the M up sampled signals into a combined signal; and reconstructing the combined signal to generate a digital signal representing the high bandwidth analog signal.

In some embodiments, the present invention is a system for converting a high bandwidth analog signal to a digital signal including: an input port for receiving the high bandwidth analog signal; M splitters for splitting the high bandwidth analog signal to M parallel channels; M delays for delaying the split signal in each channel with N*T, respectively, where N is an integer from 0 to M−1, and T is a period of a clock signal with a minimum frequency of a Nyquist frequency of the high bandwidth analog signal; M analog-to-digital converters (ADCs) for sampling each M delayed signals by M relatively prime set sampling rate; respectively, wherein the sampling rate for each M ADC is smaller than the Nyquist frequency of the high bandwidth analog signal; M upsampling circuits for upsampling each M sampled signal, wherein the upsampling rate for each M sampled signal is equal to or greater than the Nyquist frequency of the high bandwidth analog signal; a combiner for combining, element by element in time order, the M up sampled signals into a combined signal; and a circuit for reconstructing the combined signal to generate a digital signal representing the high bandwidth analog signal.

In some embodiments, the reconstruction of the combined signal is performed by a compressed sensing (CS) method.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

The present invention will now be described more fully with reference to the accompanying drawings, in which exemplary embodiments thereof are shown. The invention may, however, be embodied in many different forms and should not be construed as being limited to the embodiments set forth herein. Rather, these embodiments are provided so that this disclosure is thorough and complete, and will fully convey the concept of the present invention to those skilled in the art. In some embodiments, the method of the present invention is executed by an electronic circuit to transform a high bandwidth analog signal to a digital signal representing the analog signal.

In some embodiments, the present invention addresses the problem of aliasing in signal processing when sampling rate is well below the Nyquist rate, while reducing the number of heterodyne down conversion stages. The method and circuit of the invention solves for a minimum number of heterodyne down conversion stages employed in many applications, for example an electronic warfare (EW) receiver, and for reconstruction of sparse spectrum from an under-sampled data set.

In some embodiments, the present invention is a method and circuit to reconstruct sparse frequency domain data from sub-Nyquist sampled time domain data. This approach reduces the number of heterodyne down conversion stages and enables the use of multiple low bandwidth high resolution analog to digital converters (ADCs) without the use of any mixers and filters typically implemented by conventional methods. The approach may be employed in many applications, such as wideband receivers and signal processing of wideband signals.

Figure 1:
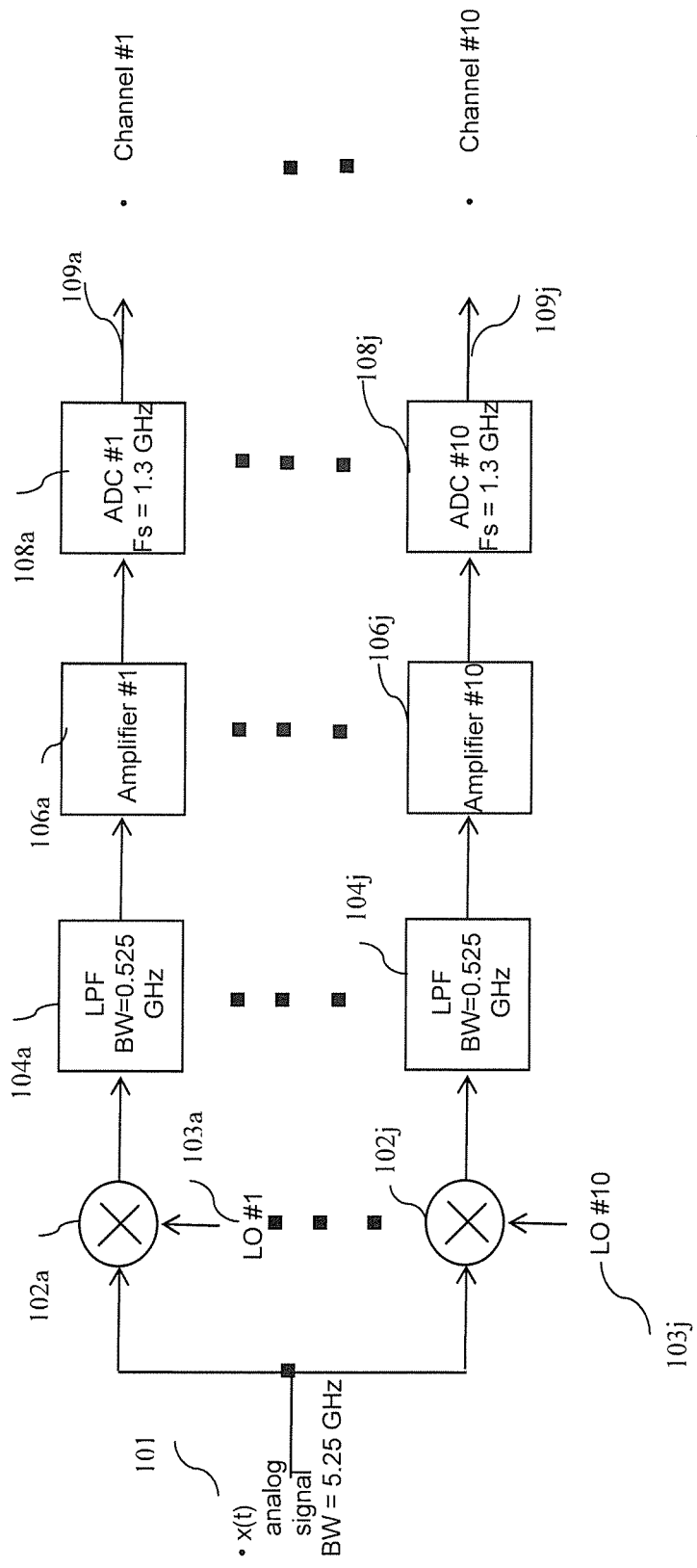
FIG. 1 shows a sampling circuit for sampling a high bandwidth analog input signal, according to the conventional methods.
Figure 2:
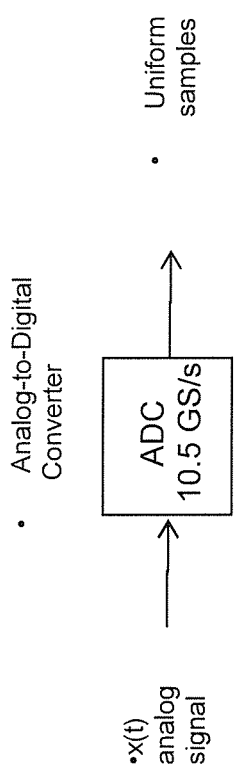
FIG. 2 illustrates an alternative sampling circuit for sampling a high bandwidth analog input signal, according to the conventional methods.
Figure 3:
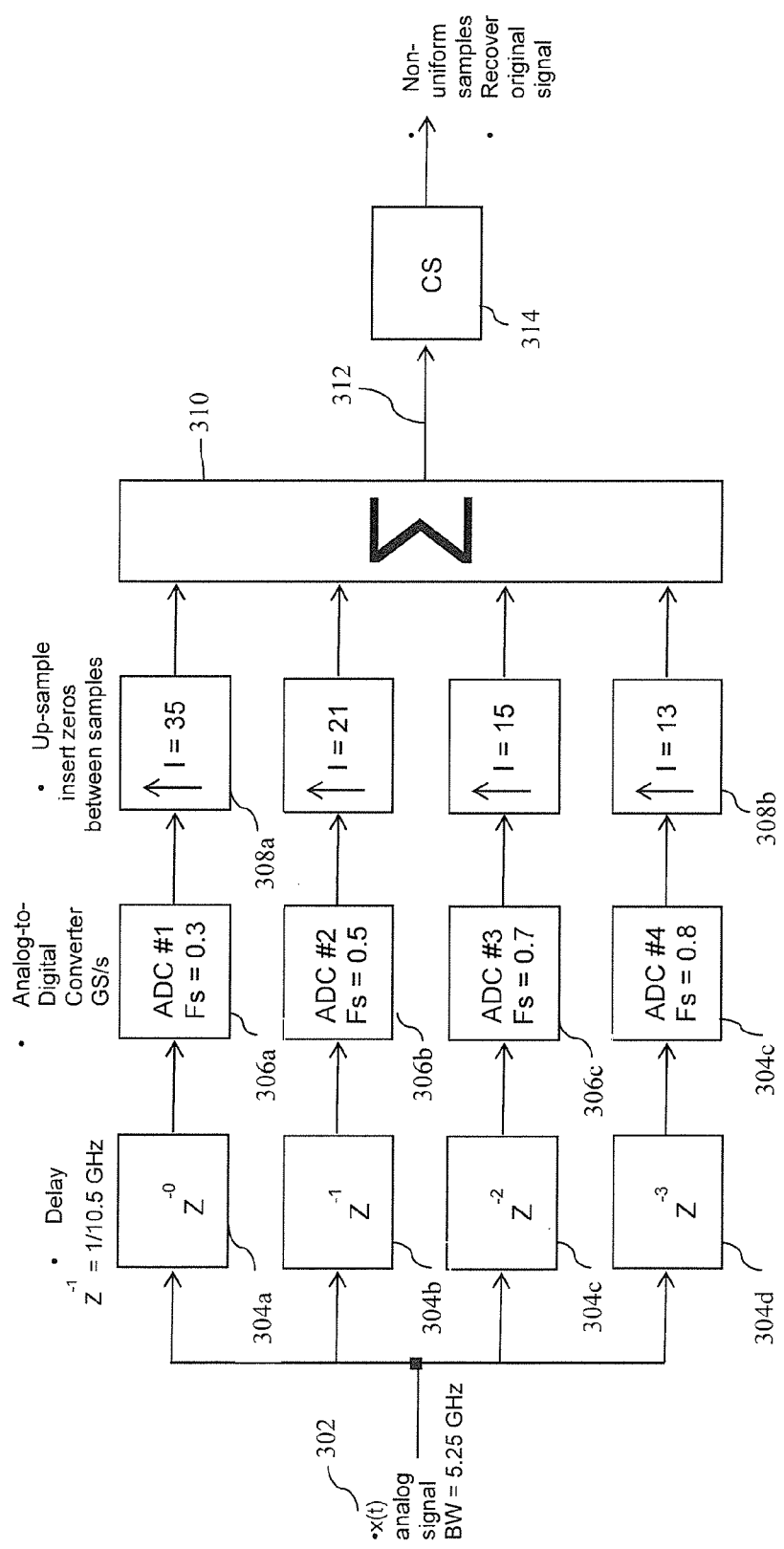
FIG. 3 shows an exemplary sampling circuit for sampling a high bandwidth analog input signal, according to some embodiments of the present invention.

FIG. 3 shows an exemplary sampling circuit for sampling a high bandwidth analog input signal, according to some embodiments of the present invention. In this example, the high bandwidth analog input signal 302 has a bandwidth of, for example, 5.25 GHz. The system's synchronous master clock has a frequency ($F_C$) of 10.5 GHz (twice of 5.25 GHz). The high bandwidth analog input signal 302 is split into M (4 in this example) down conversion channels, each having a delay stage 304, an ADC stage 306 and an up-sampling stage 308. The first down conversion channel is not delayed, the second channel is delayed by a clock cycle, the third by two clock cycles, the $M^{th}$ channel by M−1 clock cycles, and so on. In this example, the first delay circuit 304a has a delay of zero, the second delay circuit 304b has a delay of $1/F_C$ (1/10. GHz), the third delay circuit 304c has a delay of $2/F_C$, and the fourth delay circuit 304d has a delay of $3/F_C$. The delay circuits (304a-304d) ensure that all of the ADCs do not sample the input signal coincidentally at the start.

In some embodiments, the sampling among the M synchronously clocked ADC's is delayed to achieve offset sampling (discussed above) in the following manner:

Sampling of the first channel is not delayed and starts on the first active edge of the high speed master clock, $F_C$.

Sampling of the second channel is delayed by a single cycle of the high speed master clock, $F_C$.

Sampling of the third channel is delayed by two clock cycles of the high speed master clock, $F_C$.

Sampling of the $N^{th}$ channel is delayed by N−1 clock cycles of the high speed master clock, $F_C$, and so on.

These sample delays ensure that all of the ADCs do not sample the input signal coincidentally at the start. The output of these delayed signals are input to the ADCs The high speed master clock ($F_C$) is the lowest common multiple of all sample rates ($F_{S1}, F_{S2}, \ldots, F_{SM-1}, \ldots, F_{SM}$) employed to clock the M (4 in this example) ADC's employed to sample the full bandwidth signal of interest. To comply with the Nyquist theorem, the following condition needs to be satisfied:

$$F_{S1}*F_{S2}*F_{SN-1}*F_{SM}=F_C \geq F_{Nyquist} \tag{1}$$

The ADC stage, including ADCs 306a, 306b, 306c and 306d, then samples each channel with their corresponding sampling rates that are relatively prime rates and consequently ensure the absence of frequency ambiguity folding that is typically present in under-sampled systems. The $M^{th}$ channel is chosen to sample at the highest reference sampling rate $F_{SM}$, which is derived or set by the user. The higher the defined rate for the $M^{th}$ channel, the fewer the total number of channels are required, that is, the smaller the integer M.

The outputs of the ADCs (306a-306d) are then up sampled by up-sampling circuits 308a-308d, respectively. In some embodiments, each of the up-sampling circuits 308a-308d insert a predetermined number of zeros between the samples to up-sample their respective input signals. In some embodiments, each channel is up-sampled by an integer factor $I_M$ such that the product of the sampling rate with up-sample inter factor ($F_{SM} \times I_M$) is the smallest number, which is greater or equal to Nyquist rate of the input analog signal. It is desirable but not necessary that the product equals the Nyquist rate. Given the up-sample integer $I_M$ for the $M^{th}$ channel, a set S of relatively prime ordered integers is defined where each integer in the set is greater than $I_M$. Note that S a very large countable set. For each $I_k$ belonging to the set 5, there is a corresponding sampling frequency $F_{S_k}$ that satisfies the following condition:

$$(F_{Sk} \times I_k) = \text{Nyquist rate} \qquad (2)$$

Given M, a set comprised of M pairs $\{(F_{S_M}, I_M), (F_{S_{M-1}}, I_{M-1}), \ldots, (F_{S_1}, I_1)\}$ is chosen. As shown in FIG. 3, each product $(F_{S_M} * I_M) = F_C \geq F_{Nyquist}$ for each pair of sample frequencies $F_{S_M}$ and upsampling ratios $I_M$.

In this example, up-sampling circuit 308a up-samples the signal by 35 (e.eg., inserts 34 zeros between the samples at its input, 308b up-samples its input signal by 21, 308c up-samples its input signal by 15 and 308d up-samples its input signal by 13, which all meet the constraint of Equation (2).

Once up-sampled, the parallel channels are recombined via superposition of the up-sampled signals by the summation or superposition circuit 310, according to conventional method. In some embodiments, the summation or superposition circuit 310 combines the up-sampled signals, element by element in time order. The output of the summation or superposition circuit 310 are input to the Compressive Sensing (CS) block 314, which performs a CS method to recover the original signal content from the superposition of the up-sampled signals. In some embodiments, the CS algorithm performs a minimum distortion digital reconstruction of the under-sampled analog signal by solving a constrained optimization algorithm. CS is a known signal processing method where significantly fewer samples (e.g., sensor measurements) can be used to recover signals with arbitrarily fine resolution. A detailed explanation of some CS methods is provided in U.S. Pat. No. 7,403,875, the entire contents of which is hereby expressly incorporated by reference.

In the above disclosure, a non-uniformly sampled analog signal, which includes a sampled signal and an amplitude error between a signal sampled with the equidistant sample period and the non-uniformly sampled signal. The method determines a reconstructed amplitude error through the time offset and the non-uniformly sampled signal. The reconstructed amplitude error is then subtracted from the non-uniformly sampled signal to reconstruct the signal.

In some embodiments, the number of parallel down conversion channels M is chosen so that following conditions are met.

(i) To ensure no spectral foldover occurs (or to minimize the foldovers), the smallest $L_s$ is found such that the product of $F_{SM} \times (I_1 \times I_2 \times I_3 \times \ldots \times I_{Ls})$ is greater or equal Nyquist rate. This minimum is denoted as $L_s^{(min)}$, where "I" is the upsampling ratio and "L" is an arbitrary index that represents the number of parallel channels. In the above example, "L"=4.

(ii) To minimize generating virtual spectral components, referred as "ghosts", in the recovered signal, at least one more channel is added.

(ii) The combined multiple channel sampling rate needs to be consistent with the spectral occupancy of the high bandwidth analog signal. Although the overall relationship is nonlinear, this component exhibits a linear trend contribution with occupied bandwidth beyond 30 percent. If the signal occupies a percentage □ of the full bandwidth, the number $L_b$ is determined such that:

$$\alpha \times (F_{S_1} + F_{S_2} + F_{S_3} + \ldots + F_{S_{Lb}}) \qquad (3)$$

is greater or equal to ($\rho \times$Nyquist). The value of a is evaluated statistically via simulation.

(iii) M is chosen to be equal to the quantity $(1+L_s+L_b)$. That is, $$M = (1 + L_s + L_b) \qquad (4)$$

Figure 4:
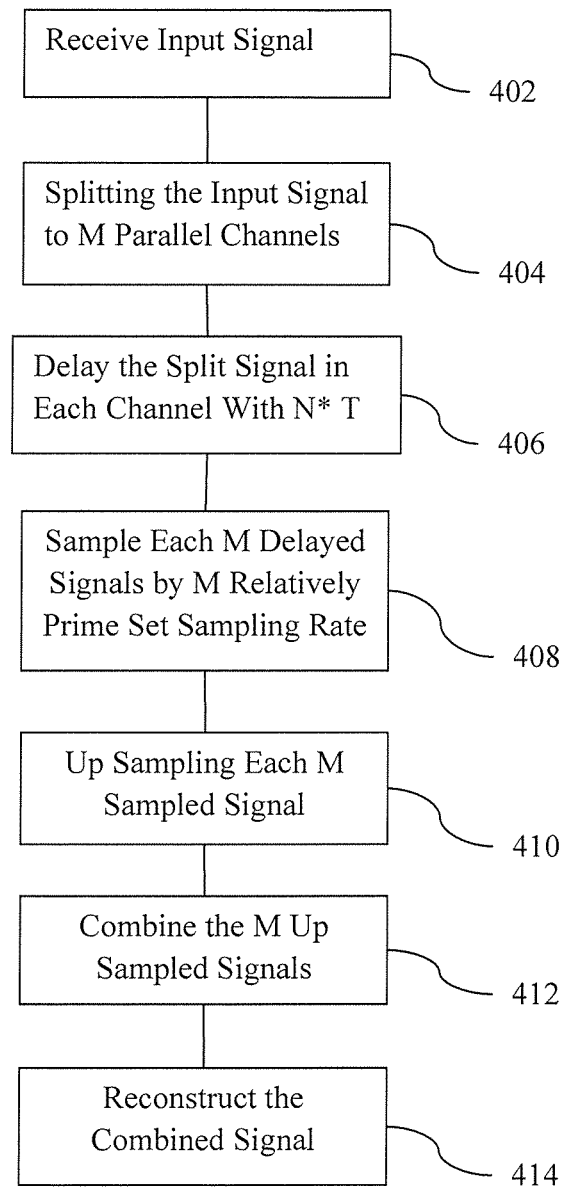
FIG. 4 shows an exemplary process flow for converting a high bandwidth analog signal to a digital signal, according to some embodiments of the present invention.

FIG. 4 shows an exemplary process flow for converting a high bandwidth analog signal to a digital signal, according to some embodiments of the present invention. As shown, a high bandwidth analog input signal is received in block 402. In block 404, the high bandwidth analog signal is split to M parallel (down conversion) channels. Each split signal in each channel is then delayed with N*T, respectively, where N is an integer number from 0 to M−1, and T is a period of the system master clock signal with a minimum frequency ($F_M$) of a Nyquist frequency of the high bandwidth analog signal, in block 406.

Each M delayed signals is then sampled (for example, by respective ADCs) by M relatively prime set sampling rate, in block 408. The sampling rate for each M delayed signal is smaller than the Nyquist frequency of the high bandwidth analog signal. In block 410, each M sampled signal is up sampled where the upsampling rate for each M sampled signal satisfying the Nyquist frequency of the high bandwidth analog signal. The M up sampled signals are then combined (superimposed) into a combined signal, in block 412. The combined (superimposed) signal is then reconstructed to generate a digital signal representing the high bandwidth analog signal. This way, the final estimate, the original time domain data and frequency spectrum is obtained (reconstructed). In some embodiments, a compressed sensing (CS) method is performed to reconstruct the digital signal representing the analog input signal.

Figures 5A, 5B, 5C:
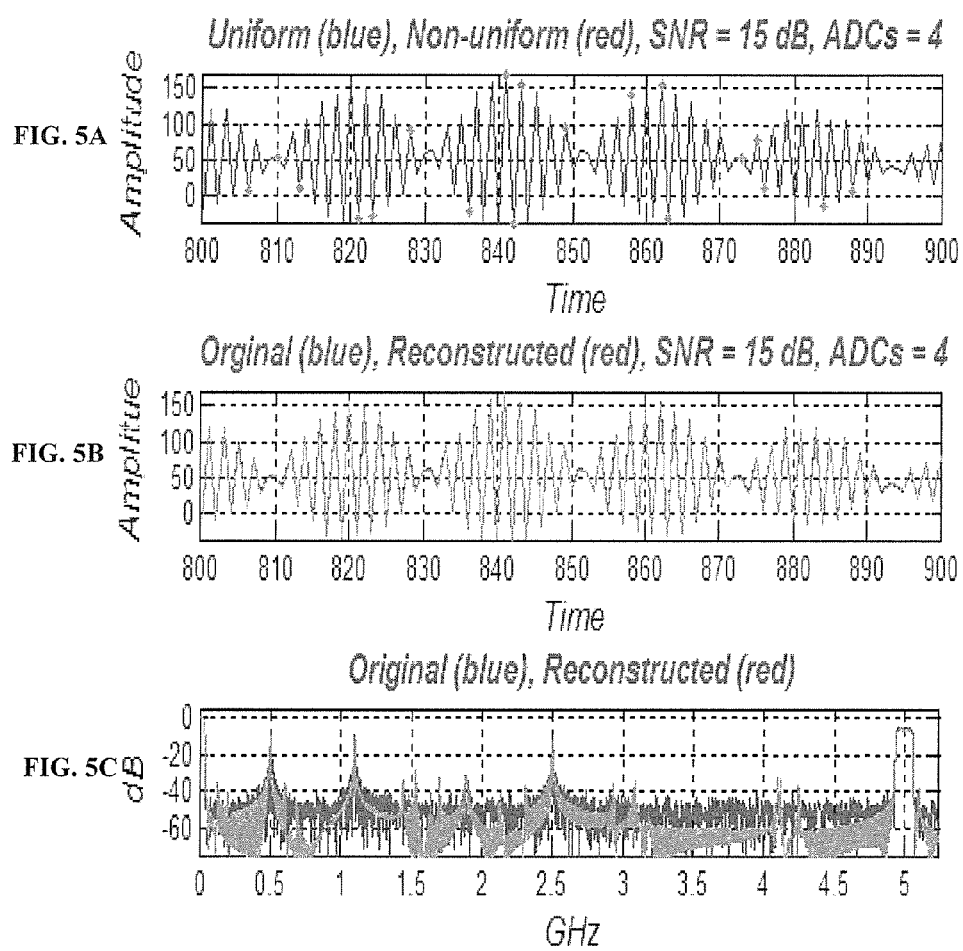
FIGS. 5A, 5B and 5C illustrate some test results of a spectrum reconstruction of an under-sampled signal, according to some embodiments of the present invention.

FIGS. 5A, 5B and 5C illustrate some test results of a spectrum reconstruction of an under-sampled signal using 4 ADCs at low sample frequencies of 0.30, 0.50, 0.70, nd 0.80 GHz, respectively. As shown in FIG. 5A, the curve represents uniform samples at full Nyquist rate (10.5 GHz, in this case) and the dots represent the non-uniform samples that are lower that the Nyquist rate. In FIG. 5B, the curve represents the reconstructed signal combined from 4 low speed and high dynamic range ADCs to yield a non-uniform sample set of the original time domain process. The ratio of non-uniform samples over uniform samples is 21 percent. That is, for every five uniform samples, there is about one non-uniform sample. As shown in FIG. 5C, the uniformly sampled signal is center at DC with a bandwidth of 25 MHz, and the non-uniformly sampled signal is centered at 5. The three continuous wave (CW) frequencies are 0.50, 1.10 and 2.5 GHz, respectively. For the above example, 0.5, 1.10, 2.5 GHz are the frequency location of individual signals within the 5.25 GHz wideband RF spectrum centered around DC.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method for converting a high bandwidth analog signal to a digital signal, the method comprising:
   receiving the high bandwidth analog signal;
   splitting the high bandwidth analog signal to M parallel channels;
   delaying the split signal in each channel with N*T delays, respectively, where N is an integer from 0 to M−1, and T is a period of a clock signal with a minimum frequency of the Nyquist frequency of the high bandwidth analog signal;
   sampling each M delayed signals by M relatively prime sampling rate, wherein the sampling rate for each M delayed signal is smaller than the Nyquist frequency of the high bandwidth analog signal;
   upsampling each M sampled signal using an upsampling ratio, wherein the upsampling rate for each M sampled signal satisfies the Nyquist frequency of the high bandwidth analog signal;
   combining the M up sampled signals into a combined signal; and
   reconstructing the combined signal to generate a digital signal representing the high bandwidth analog signal, wherein said reconstructing the combined signal is performed by a compressed sensing method.

2. The method of claim 1, wherein M is equal to 4 and T is equal to 1/10.5 GHz.

3. The method of claim 2, wherein the upsampling ratio for the first channel is 35, for the second channel is 21, for the third channel is 15, and for the fourth channel is 13.

4. The method of claim 1, wherein M, the number of parallel channels, is selected to minimize the foldovers and the ghost in the digital signal.

5. A receiver adapted to perform the method of claim 1.

6. A system for converting a high bandwidth analog signal to a digital signal comprising:
   an input port for receiving the high bandwidth analog signal;
   M splitters for splitting the high bandwidth analog signal to M parallel channels;
   M delays for delaying the split signal in each channel with N*T, respectively, where N is an integer from 0 to M−1, and T is a period of a clock signal with a minimum frequency of a Nyquist frequency of the high bandwidth analog signal;
   M analog-to-digital converters (ADCs) for sampling each M delayed signals by M relatively prime set sampling rate, respectively, wherein the sampling rate for each M ADC is smaller than the Nyquist frequency of the high bandwidth analog signal;
   M upsampling circuits for upsampling each M sampled signal, wherein the upsampling rate for each M sampled signal is equal to or greater than the Nyquist frequency of the high bandwidth analog signal;
   a combiner for combining, element-by-element in time order, the M up sampled signals into a combined signal; and
   a circuit for reconstructing the combined signal to generate a digital signal representing the high bandwidth analog signal wherein M is selected to minimize the foldovers and the ghost in the digital signal.

7. The system of claim 6, wherein said circuit for reconstructing the combined signal is adapted to reconstruct the combined signal using a compressed sensing method.

8. The system of claim 6, wherein M is equal to 4 and T is equal to 1/10.5 GHz.

9. The system of claim 8, wherein the upsampling rate for the first upsampling circuit is 35, for the second first upsampling circuit is 21, for the third first upsampling circuit is 15, and for the fourth first upsampling circuit is 13.

10. A receiver including the system of claim 6.

11. A method for converting a high bandwidth analog signal to a digital signal, the method comprising:
    receiving the high bandwidth analog signal;
    splitting the high bandwidth analog signal to M parallel channels;
    delaying the split signal in each channel with N*T delays, respectively, where N is an integer from 0 to M−1, and T is a period of a clock signal with a minimum frequency of the Nyquist frequency of the high bandwidth analog signal;
    sampling each M delayed signals by M relatively prime sampling rate, wherein the sampling rate for each M delayed signal is smaller than the Nyquist frequency of the high bandwidth analog signal;
    upsampling each M sampled signal using an upsampling ratio, wherein the upsampling rate for each M sampled signal satisfies the Nyquist frequency of the high bandwidth analog signal;
    combining the M up sampled signals into a combined signal; and
    reconstructing the combined signal to generate a digital signal representing the high bandwidth analog signal, wherein M, the number of parallel channels, is selected to minimize the foldovers and the ghost in the digital signal.

12. The method of claim 11, wherein said reconstructing the combined signal is performed by a compressed sensing method.

13. The method of claim 11, wherein M is equal to 4 and T is equal to 1/10.5 GHz.

14. The method of claim 13, wherein the upsampling ratio for the first channel is 35, for the second channel is 21, for the third channel is 15, and for the fourth channel is 13.

15. A receiver adapted to perform the method of claim 11.

* * * * *